(12) United States Patent
Tsai et al.

(10) Patent No.: US 9,857,508 B2
(45) Date of Patent: Jan. 2, 2018

(54) COLOR FILTER PATTERN AND MANUFACTURING METHOD THEREOF

(71) Applicant: United Microelectronics Corp., Hsinchu (TW)

(72) Inventors: Hsin-Ting Tsai, Hsinchu (TW); Cheng-Hung Yu, Taoyuan (TW); Chin-Kuang Liu, Hsinchu (TW); Ming-Hsin Lee, Taoyuan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/287,527

(22) Filed: Oct. 6, 2016

(65) Prior Publication Data

US 2017/0023712 A1 Jan. 26, 2017

Related U.S. Application Data

(62) Division of application No. 14/611,858, filed on Feb. 2, 2015, now Pat. No. 9,507,264.

(51) Int. Cl.
| | |
|---|---|
| *G02B 5/22* | (2006.01) |
| *G02B 5/20* | (2006.01) |
| *G03F 7/20* | (2006.01) |
| *G03F 7/00* | (2006.01) |
| *G03F 7/095* | (2006.01) |

(52) U.S. Cl.
CPC ............ *G02B 5/201* (2013.01); *G03F 7/0007* (2013.01); *G03F 7/0035* (2013.01); *G03F 7/095* (2013.01); *G03F 7/2002* (2013.01); *G03F 7/203* (2013.01); *G03F 7/2004* (2013.01); *G03F 7/2022* (2013.01)

(58) Field of Classification Search
CPC ...... G03F 7/0007; G03F 7/0035; G03F 7/095; G03F 7/2002; G03F 7/2004; G03F 7/2022; G03F 7/203; G02B 5/201; G02B 5/22
USPC .......................................................... 359/885
See application file for complete search history.

(56) References Cited

U.S. PATENT DOCUMENTS

| | | | |
|---|---|---|---|
| 6,245,492 B1 | 6/2001 | Huang et al. | |
| 6,881,524 B2 | 4/2005 | Cauchi et al. | |
| 7,286,207 B2 | 10/2007 | Nolscher et al. | |
| 2008/0017945 A1* | 1/2008 | Wu ........................ | G02B 5/201 257/440 |
| 2012/0315581 A1 | 12/2012 | Hatakeyama et al. | |

* cited by examiner

*Primary Examiner* — Euncha Cherry
(74) *Attorney, Agent, or Firm* — J.C. Patents

(57) ABSTRACT

A color filter pattern including a plurality of color filters arranged in a pattern and the manufacturing method thereof are provided. By performing at least one two-stage exposure process to a color filter layer, the plurality of color filters are formed with a sharp profile.

13 Claims, 11 Drawing Sheets

US 9,857,508 B2

COLOR FILTER PATTERN AND MANUFACTURING METHOD THEREOF

CROSS-REFERENCE TO RELATED APPLICATION

This application is a divisional application of and claims the priority benefit of U.S. application Ser. No. 14/611,858, filed on Feb. 2, 2015, now allowed. The entirety of the above-mentioned patent application is hereby incorporated by reference herein and made a part of this specification.

BACKGROUND OF THE INVENTION

1. Field of the Invention

The present invention generally relates to a filter and the manufacturing method thereof, in particular, to a color filter pattern and the manufacturing method thereof.

2. Description of Related Art

The color filters included in most flat panel displays and optical elements generally have color patterns of three primary colors, red (R), green (G) and blue (B). Photolithography has been widely used for producing large-sized, high-resolution color filters, and the color filters may be produced by applying a colored photocurable composition (photoresist composition) onto a support, drying the coated film, and exposing and developing the dried coated film with a pattern.

However, as the size of the pixels or pattern keeps decreasing, it becomes more challenging to attain the positional accuracy of the obtained pattern for the color filters. Also, because of the bottom reflected light during the exposure process, taper profiles are commonly observed at the lower portions of the color filters (negative resist layer).

SUMMARY OF THE INVENTION

The embodiment of the present invention provides a green color filter pattern comprising a plurality of green color filters on a substrate. Each of the plurality of green color filters has a substantially vertical sidewall and a slant jut located at the bottom of the sidewall and protruding outwards from the sidewall, and a height of the jut is less than fifth of a height of each of the plurality of green color filters.

The embodiment of the present invention provides a color filter pattern, comprising a plurality of green color filters, a plurality of blue color filters and a plurality of red color filters disposed on a substrate. Each of the plurality of green color filters has a substantially vertical sidewall and a slant jut located at the bottom of the sidewall and protruding outwards from the sidewall. A height of the jut is less than a height of each of the plurality of green color filters. The plurality of blue color filters disposed on the substrate is located beside the plurality of green color filters. The plurality of red color filters disposed on the substrate is located beside the plurality of green color filters and beside the plurality of blue color filters.

The embodiment of the present invention provides a method of forming a green color filter pattern. A green color filter layer is formed on a substrate and a first two-stage exposure process is performed to the green color filter layer. The two-stage exposure process comprises performing a first exposure process with a first light at a first wavelength to expose a portion of the green color filter layer and performing a second exposure process with a second light at a second wavelength to the exposed portion of the green color filter layer. The first wavelength of the first light is shorter than the second wavelength of the second light. Then, unexposed portions of the green color filter layer are removed to form the green color filter pattern.

The embodiment of the present invention provides a method of forming a photoresist pattern. A photoresist layer is formed on a substrate and a first two-stage exposure process is performed to the photoresist layer. The two-stage exposure process comprises performing a first exposure process with a first light at a first wavelength to expose a portion of the photoresist layer and performing a second exposure process with a second light at a second wavelength to the exposed portion of the photoresist layer. The first wavelength of the first light is shorter than the second wavelength of the second light. Then, unexposed portions of the photoresist layer are removed to form the photoresist pattern.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
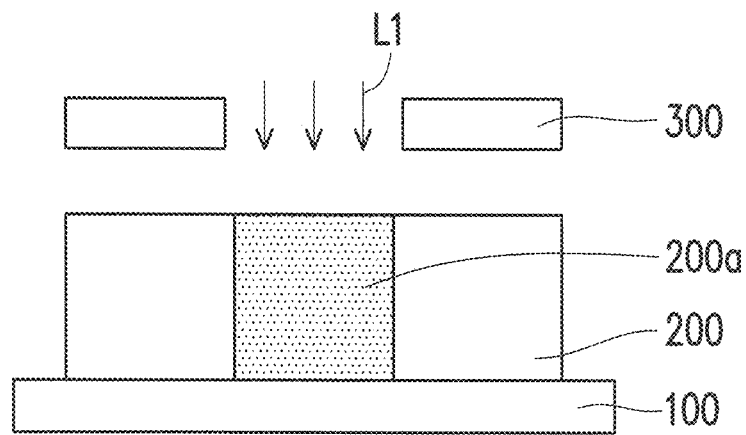
FIGS. 1A-1C are schematic cross-sectional views of the process steps for forming a color filter.

Reference will now be made in detail to the present preferred embodiments of the invention, examples of which are illustrated in the accompanying drawings. Wherever possible, the same reference numbers are used in the drawings and the description to refer to the same or like parts. In the following embodiment, a circuit trace part of a portable device is described as an example for illustration. It is not intended to limit the method or the part structure by the exemplary embodiments described herein.

Figure 1B:
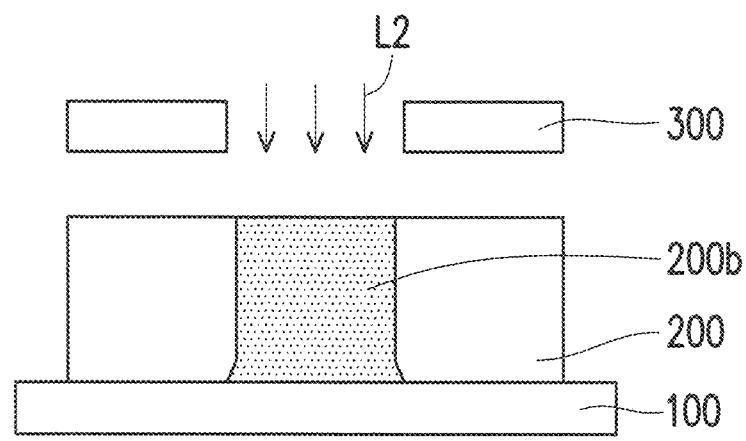
Figure 1C:
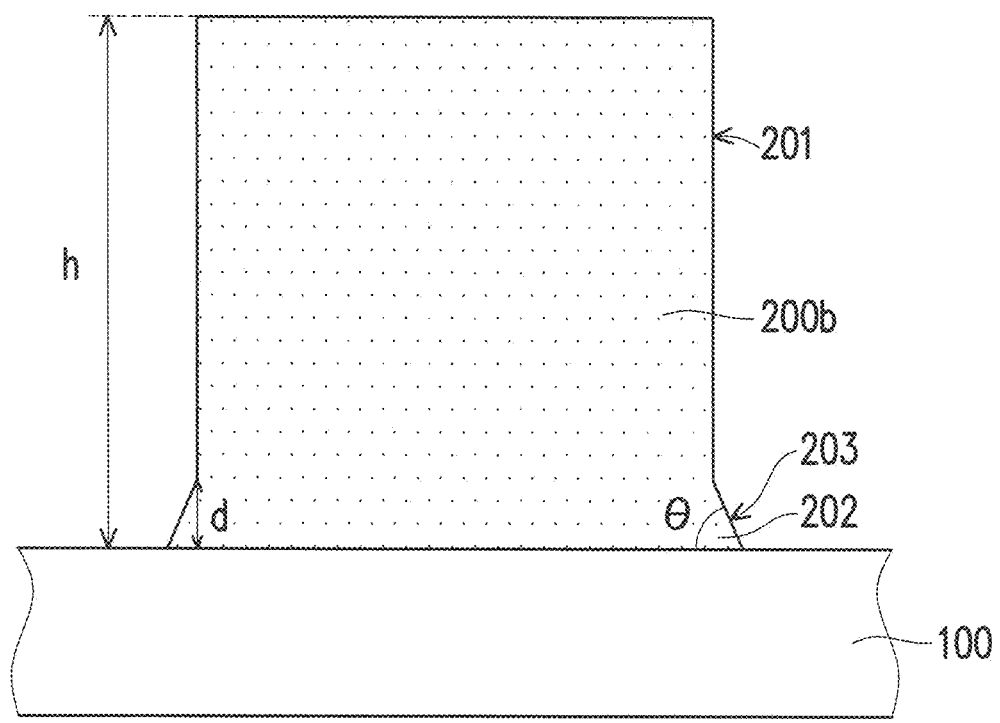

FIGS. 1A-1C are schematic cross-sectional views of the process steps for forming a color filter. As shown in FIG. 1A, a photoresist layer 200 is formed on a substrate 100. The substrate 100 may be a transparent substrate or an opaque substrate, for example. The transparent substrate may be a glass substrate, for example. The opaque substrate may be a silicon wafer or a semiconductor compound substrate, for example. The photoresist layer 200 may be a color filter layer formed from a photoresist layer dispersed with selected pigments, for example. The color filter layer may be a green color filter layer, a blue color filter layer or a red color filter layer. Then, after a photo-mask 300 is provided and placed over the photoresist layer 200, a first exposure step L1 with the light of a first wavelength is performed to the photoresist layer 200, and the photoresist layer 200 is partially exposed. The exposed portion 200a of the photoresist layer 200 is slightly cross-linked. For example, the light of the first wavelength may be the deep ultraviolet (DUV) light at 248 nm or at 193 nm. The DUV light at 248 nm may be provided by a KrF excimer laser, or the DUV at 193 nm may be provided by an ArF excimer laser. The DUV lithography is able to pattern features sizes as small as 32 nm and below. When the deep ultraviolet (DUV) light at 248 nm is used in the first exposure step, as the DUV light can penetrate deeper into the photoresist layer 200 with less reflection from the bottom layer (bottom reflection), the exposed portion 200a is slightly cross-linked with upright and straight sidewalls of the exposed portion 200a.

In FIG. 1B, the photo-mask 300 is remained over the photoresist layer 200, a second exposure step L2 with the light of a second wavelength is performed to the photoresist layer 200, and the photoresist layer 200 is partially exposed again. As the photo-mask 300 remains at the same position, the exposed portion 200a of the photoresist layer 200 is exposed again during the second exposure step L2 to become the exposed portion 200b, and the exposed portion 200b is firmly and fully cross-linked. Then, the unexposed portions of the photoresist layer 200 are removed during the development step.

Afterwards, in FIG. 1C, after removing the unexposed portions of the photoresist layer 200, the exposed portion 200b is remained. The remained exposed portion 200b in fact is a color filter with a predetermined pattern. Although only one exposed portion 200b is shown herein for illustration purposes, it is understood that more than one portions 200b are obtained and the portions 200b are color filters arranged in a pattern as shown in later figures. The two continuous exposure steps as shown in FIG. 1A and 1B may be considered as one exposure process performed in two-stage (i.e., a two-stage exposure process) to form color filters in a pattern (color filter pattern) from the photoresist layer (color filter layer).

For example, the light of the second wavelength may be the ultraviolet (UV) light at 365 nm ("i-line"), 405 nm ("h-line") or 436 nm ("g-line"). The UV light may be provided by a mercury lamp or UV lamp. When the ultraviolet (UV) light at 365 nm ("i-line") is used in the second exposure step, as the partially cross-linked exposed portion 200a may block DUV light to a certain extent, the bottom reflection of the UV light is reduced and the phenomenon of the tapper profile is alleviated. By using the two-stage exposure process, the resolution of the color filter pattern is enhanced. In principle, the first wavelength is shorter than the second wavelength, and the energy level for the light of the second wavelength (e.g. DUV light at 248 nm or 193 nm) may be lower than the energy level of the light of the first wavelength (e.g., i-line at 365 nm).

As shown in FIG. 1C, although the bottom reflection is lessened, there is still small bottom reflection of the light. Owing to the small bottom reflection of the light, the substantially upright and vertical sidewall 201 of the remained exposed portion 200b has a slant jut 202 located at the bottom of the sidewall and protruding outwards from the sidewall 201. A height d of the jut 202 is less than fifth of the height h of the remained exposed portion 200b. Preferably, the height d of the jut 202 is less than tenth of the height h of the remained exposed portion 200b. The angle θ between the slat surface 203 of the slant jut 202 and the substrate 100 is less than 30 degrees, for example.

FIG. 2A-FIG. 2D illustrate the schematic top views of the manufacturing process steps of color filters according to one embodiment of the present invention.

Figure 2A:
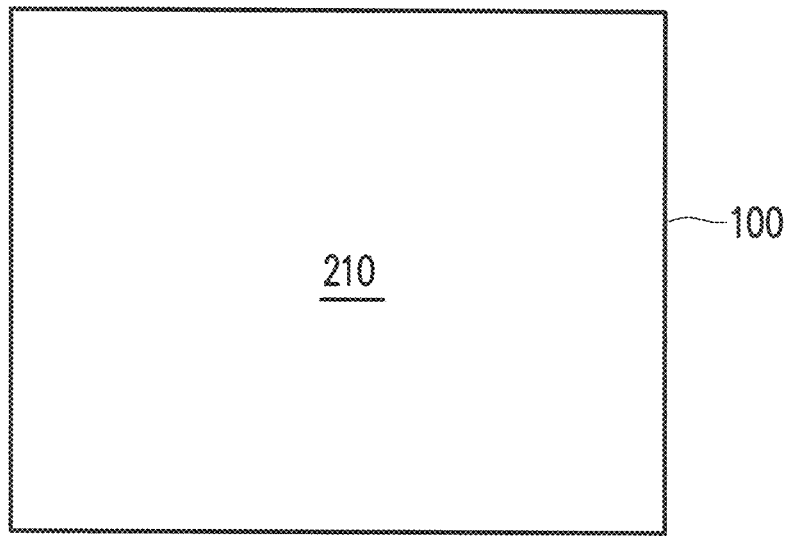
FIG. 2A-FIG. 2D illustrate the schematic top views of the manufacturing process steps of color filters according to one embodiment of the present invention.

In FIG. 2A, a photoresist layer 210 is provided. The photoresist layer 210 may be formed on a substrate 100 by spin coating, for example. In this embodiment, the photoresist layer 210 is a green color filter layer.

Figure 2B:
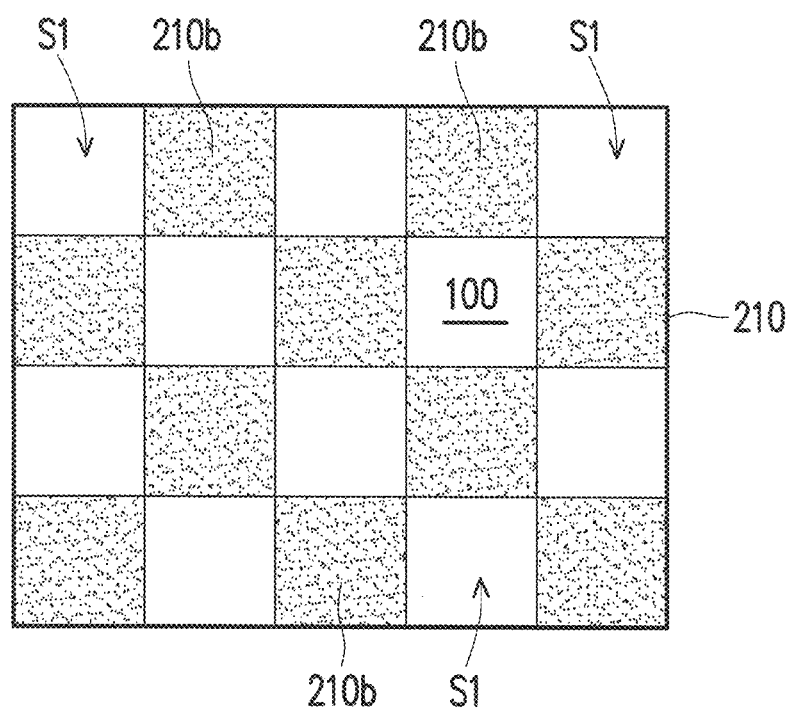

In FIG. 2B, a two-stage exposure process is performed to the photoresist layer 210 and exposed portions 210b of the photoresist layer 210 are formed. Similar to the two continuous exposure process steps described in FIGS. 1A-1B, the two-stage exposure process includes performing a first exposure step at 248 nm and then a second exposure step at 365 nm. Hence, the photoresist layer (green color filter layer) 210 is exposed twice during the two-stage exposure process to form the exposed portions 210b. The exposed portions 210b are green color filters and the green color filters 210b are arranged in a checker pattern. That is, the green color filters 210b arranged in a specific pattern consist of the green color filter pattern. Then, a development process is performed and the unexposed portions of the photoresist layer 210 are removed to form openings S1 by the green color filters 210b.

Figure 2C:
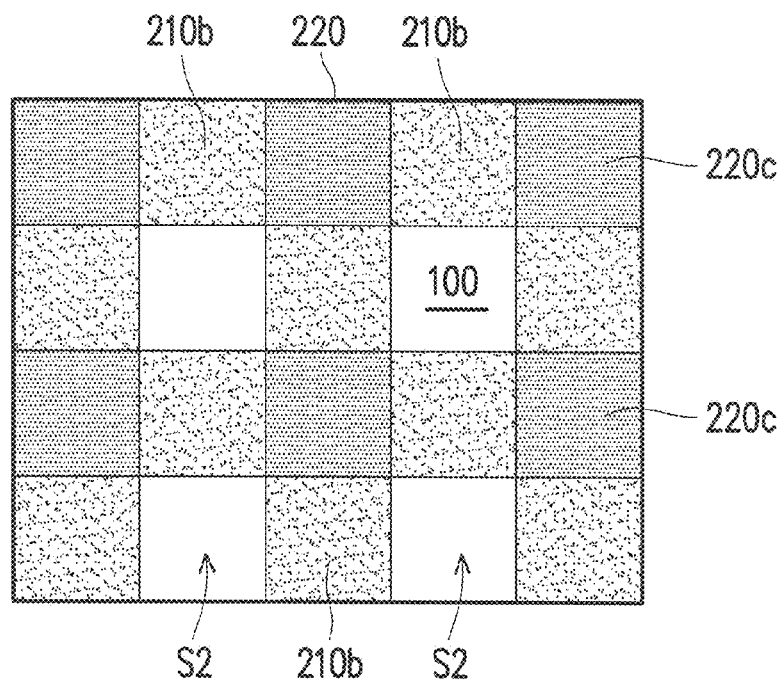

In FIG. 2C, another photoresist layer 220 is formed over the green color filters 210b and filling into the openings S1 (FIG. 2B) by spin coating, for example. The photoresist layer 220 is a blue color filter layer, for example. Another exposure process is performed to the photoresist layer 220 with the light of a wavelength of 365 nm, so that the photoresist layer 220 is partially exposed to form the exposed portions 220c. Herein, the photoresist layer 220 is only exposed once during the exposure process to form the exposed portions 220c, and the exposed portions 220c are blue color filters formed within the openings S1 are arranged in a tartan check pattern. Herein, in addition to the pattern of the photo-mask used in the exposure process, the pattern or the shape of the blue color filters 220c is further defined through the formation of the openings S1 and the green color filters 210b in the previous process. That is, the two-stage exposure process attributed to higher resolution of color filter pattern may not be needed as the to-be formed blue color filters 220C are fully restrained by the previously formed green color filters 210b. Then, the unexposed portions of the photoresist layer 220 are removed during the development step to form openings S2 by the green color filters 210b and the blue color filters 220c.

Figure 2D:
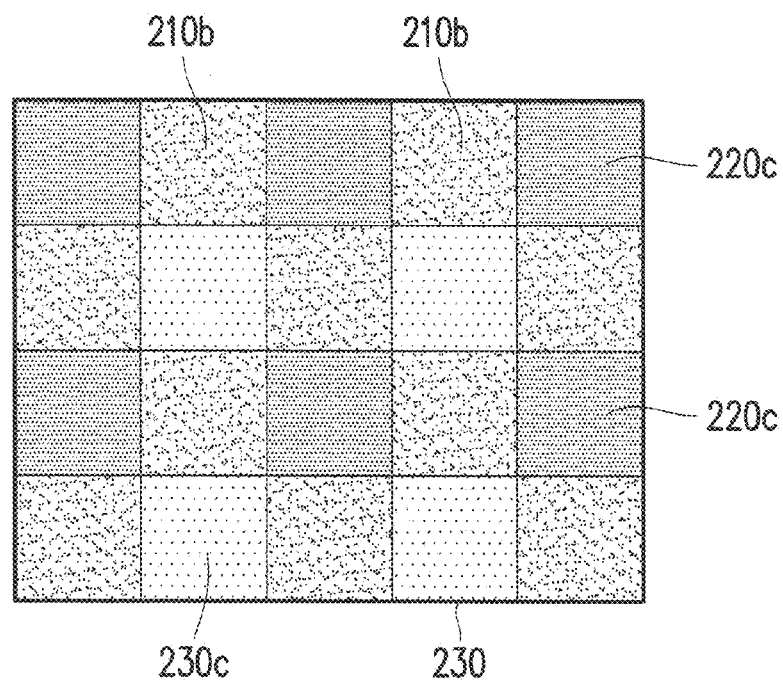

Later, in FIG. 2D, another photoresist layer 230 is formed over the green color filters 210b, the blue color filters 220c and filling into the openings S2 (FIG. 2C) by spin coating, for example. The photoresist layer 230 is a red color filter layer, for example. Another exposure process is performed to the photoresist layer 230 with the light of a wavelength of 365 nm, so that the photoresist layer 230 is partially exposed to form the exposed portions 230c. Herein, the photoresist layer 230 is only exposed once during the exposure process to form the exposed portions 230c, and the exposed portions 230c are red color filters formed within the openings S2 and the red color filters 230c are arranged in a tartan check pattern. Herein, in addition to the pattern of the photo-mask used in the exposure process, the pattern or the shape of the red color filters 230c is further defined through the formation of the openings S2, the blue color filters 220c and the green color filters 210b in the previous process. That is, the two-stage exposure process attributed to higher resolution of color filter pattern may not be needed as the to be formed red color filters 230c are fully restrained by the previously formed green color filters 210b and blue color filters 220c. Then, the unexposed portions of the photoresist layer 230 are removed during the development step.

Figure 3:
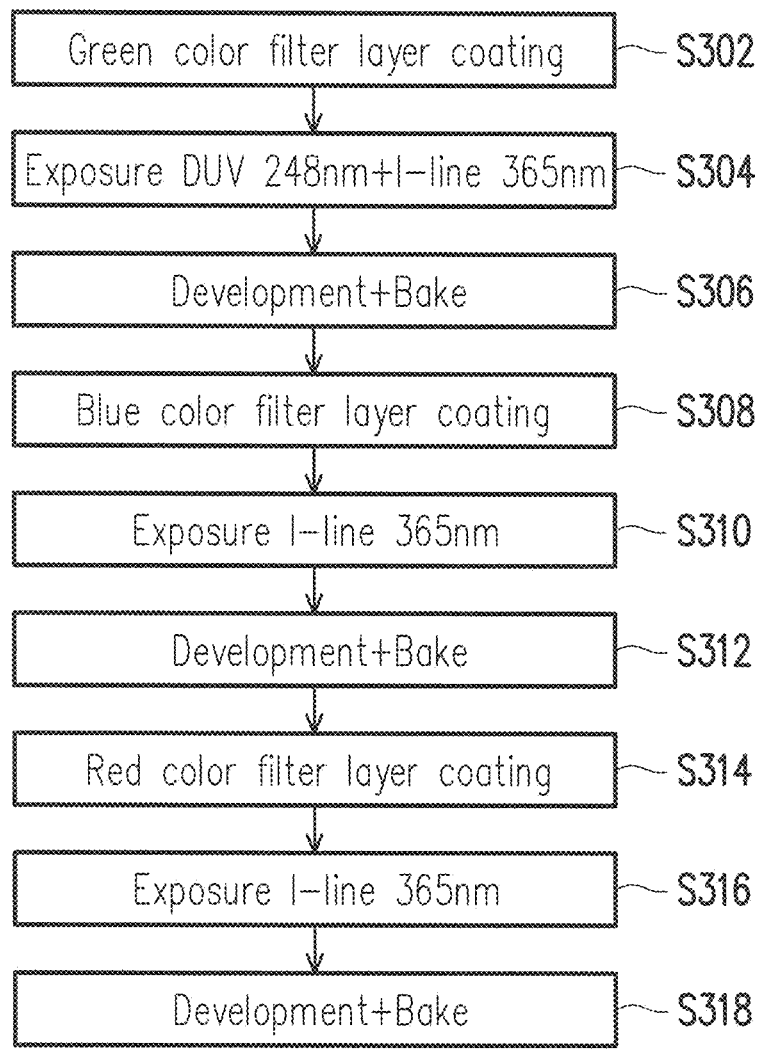
FIG. 3 is a flow chart of the manufacturing process steps of color filters according to one embodiment of the present invention.

FIG. 3 is a flow chart of the manufacturing process steps of color filters according to one embodiment of the present invention. The layout of the pattern of the green, blue and red color filters may refer to FIGS. 2A-2D.

As described in Step S302 of FIG. 3, a green color filter layer is coated. Then, in Step S304, the green color filter layer is exposed twice by the two-stage exposure process of a first exposure step using the DUV light at 248 nm and then a second exposure step using i-line light at 365 nm. In Step 306, the development process is performed to remove the unexposed portions of the green color filter layer, and then a baking (post-baking) process is performed, so that green color filters in a specific pattern are obtained. In Step S308 of FIG. 3, a blue color filter layer is coated over the green color filters. Then, in Step S310, the blue color filter layer is exposed by performing an exposure process using i-line light at 365 nm. In Step 312, the development process is performed to remove the unexposed portions of the blue color filter layer, and then a baking (post-baking) process is performed, so that blue color filters in a specific pattern are obtained. In Step S314, a red color filter layer is coated over the green color filters and the blue color filters. Then, in Step S316, the red color filter layer is exposed by performing an exposure process using i-line light at 365 nm. In Step 318, the development process is performed to remove the unexposed portions of the red color filter layer, and then a baking (post-baking) process is performed, so that red color filters in a specific pattern are obtained.

FIG. 4A-FIG. 4D illustrate the schematic top views of the manufacturing process steps of color filters according to another embodiment of the present invention.

Figure 4A:
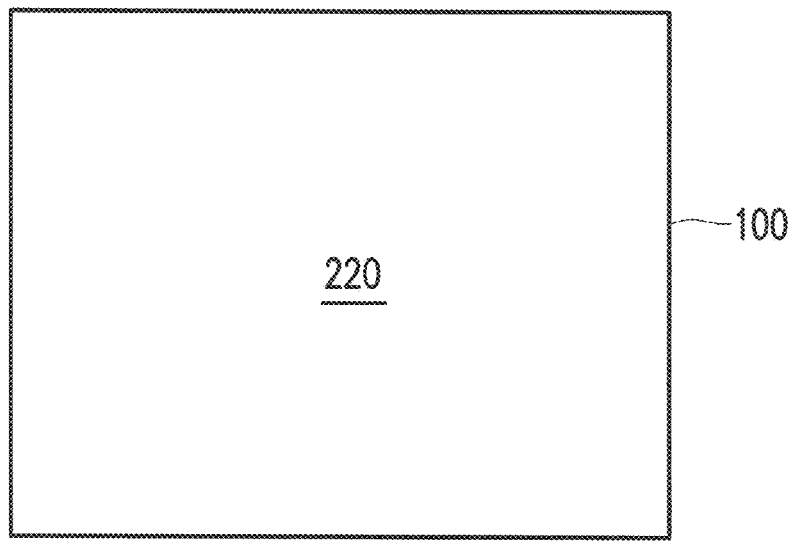
FIG. 4A-FIG. 4D illustrate the schematic top views of the manufacturing process steps of color filters according to one embodiment of the present invention.

In FIG. 4A, a photoresist layer 220 is provided. The photoresist layer 220 may be formed on a substrate 100 by spin coating, for example. In this embodiment, the photoresist layer 220 is a blue color filter layer.

Figure 4B:
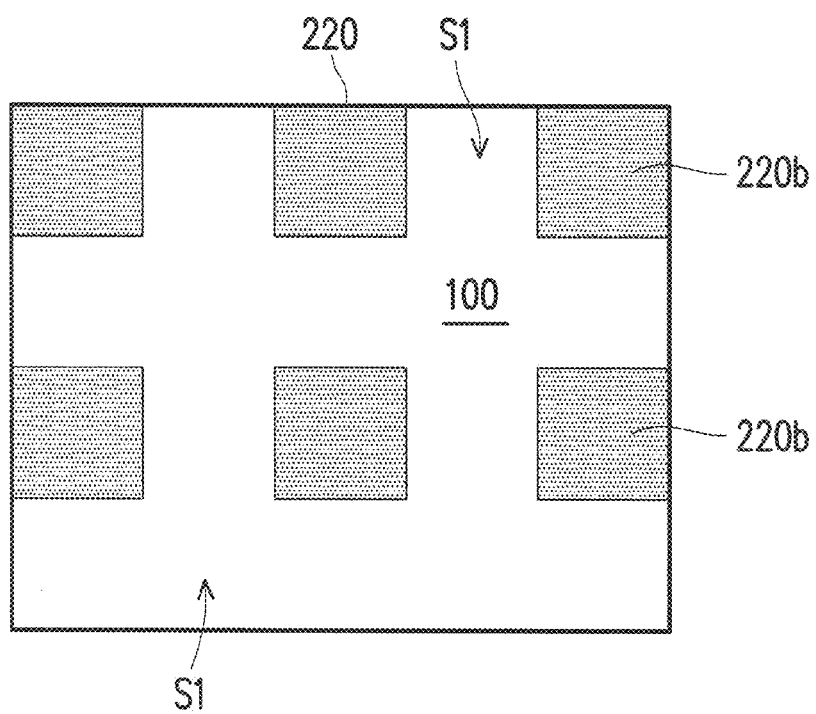

In FIG. 4B, a two-stage exposure process is performed to the photoresist layer 220 and exposed portions 220b of the photoresist layer 220 are formed. Similar to the two continuous exposure process steps described in FIG. 1A-1B, the two-stage exposure process includes performing a first exposure step at 248 nm and then a second exposure step at 365 nm. Hence, the photoresist layer (blue color filter layer) 220 is exposed twice during the two-stage exposure process to form the exposed portions 220b. The exposed portions 220b are blue color filters and the blue floor filters 220b are arranged in a tartan check pattern. Then, a development process is performed and the unexposed portions of the photoresist layer 220 are removed to form the opening S1 surrounding the blue color filters 220b.

Figure 4C:
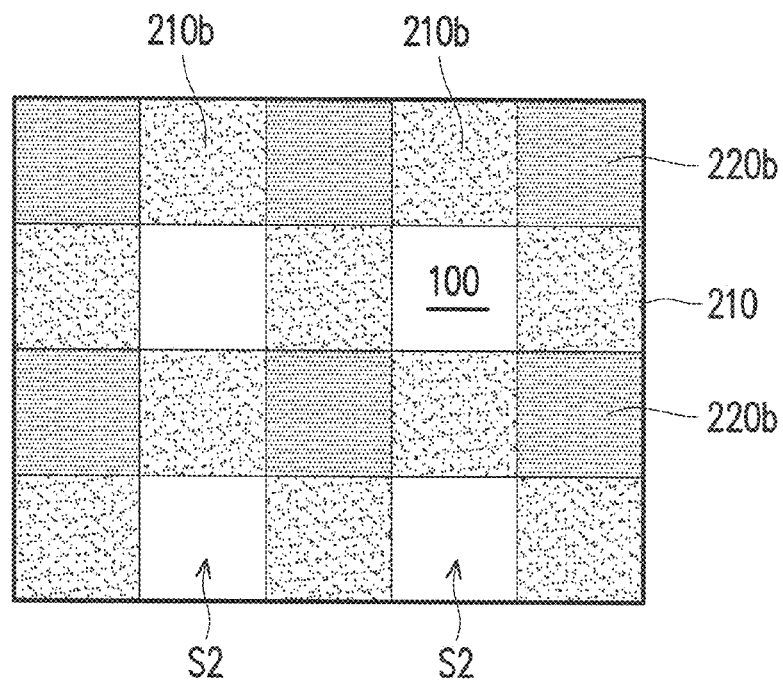

In FIG. 4C, another photoresist layer 210 is formed over the blue color filters 220b and filling into the opening S1 (FIG. 4B) by spin coating, for example. The photoresist layer 210 is a green color filter layer, for example. Another two-stage exposure process is performed to the photoresist layer 210 and the exposed portions 210b of the photoresist layer 210 are formed. Similar to the two continuous exposure process steps described in FIGS. 1A-1B, the two-stage exposure process includes performing a first exposure step at 248 nm and then a second exposure step at 365 nm. Hence, the photoresist layer (green color filter layer) 210 is exposed twice during the two-stage exposure process to form the exposed portions 210b. The exposed portions 210b are green color filters formed within the opening S1 and the green color filters are arranged in a checker pattern. Herein, in addition to the pattern of the photo-mask used in the exposure process, the pattern or the shape of the green color filters 210b is further defined through the formation of the blue color filters 220b and the opening S1 in the previous process. However, because the to-be formed green color filters 210b is only partially restrained by the previously formed blue color filters 220b, the two-stage exposure process attributed to higher resolution of color filter pattern may still be needed. Then, the unexposed portions of the photoresist layer 210 are removed during the development step to form openings S2 by the green color filters 210b and the blue color filters 220b.

Figure 4D:
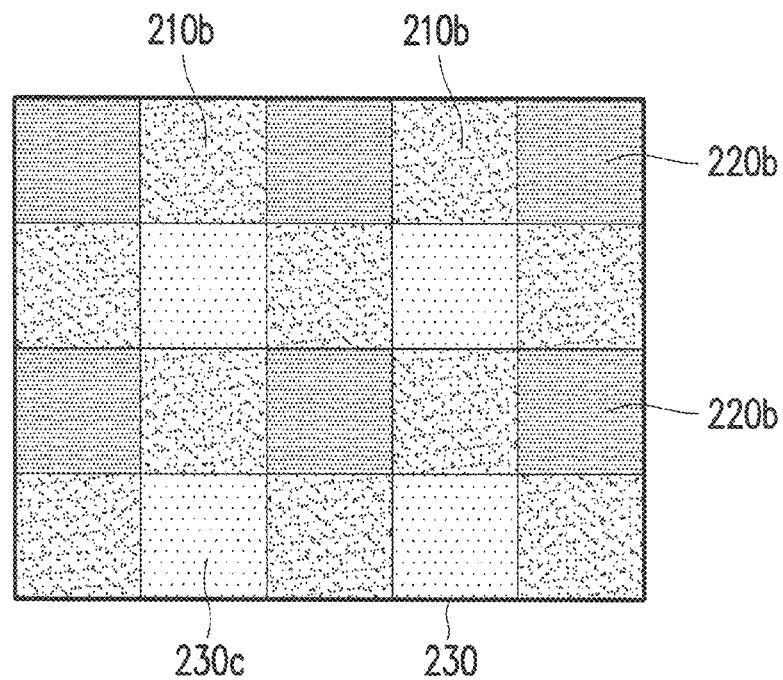

Later, in FIG. 4D, another photoresist layer 230 is formed over the green color filters 210b, the blue color filters 220b and filling into the openings S2 (FIG. 4C) by spin coating, for example. The photoresist layer 230 is a red color filter layer, for example. Another exposure process is performed to the photoresist layer 230 with the light of a wavelength of 365 nm, so that the photoresist layer 230 is partially exposed to form the exposed portions 230c. Herein, the photoresist layer 230 is only exposed once during the exposure process to form the exposed portions 230c, and the exposed portions 230c are red color filters formed within the openings S2 and the red color filters 230c are arranged in a tartan check pattern. Herein, in addition to the pattern of the photo-mask used in the exposure process, the pattern or the shape of the red color filters 230c is further defined through the formation of the openings S2, the blue color filters 220b and the green color filters 210b in the previous process. That is, the two-stage exposure process attributed to higher resolution of color filter pattern may not be needed as the to be formed red color filters 230c are fully restrained by the previously formed green color filters 210b and blue color filters 220b. Then, the unexposed portions of the photoresist layer 230 are removed during the development step.

Figure 5:
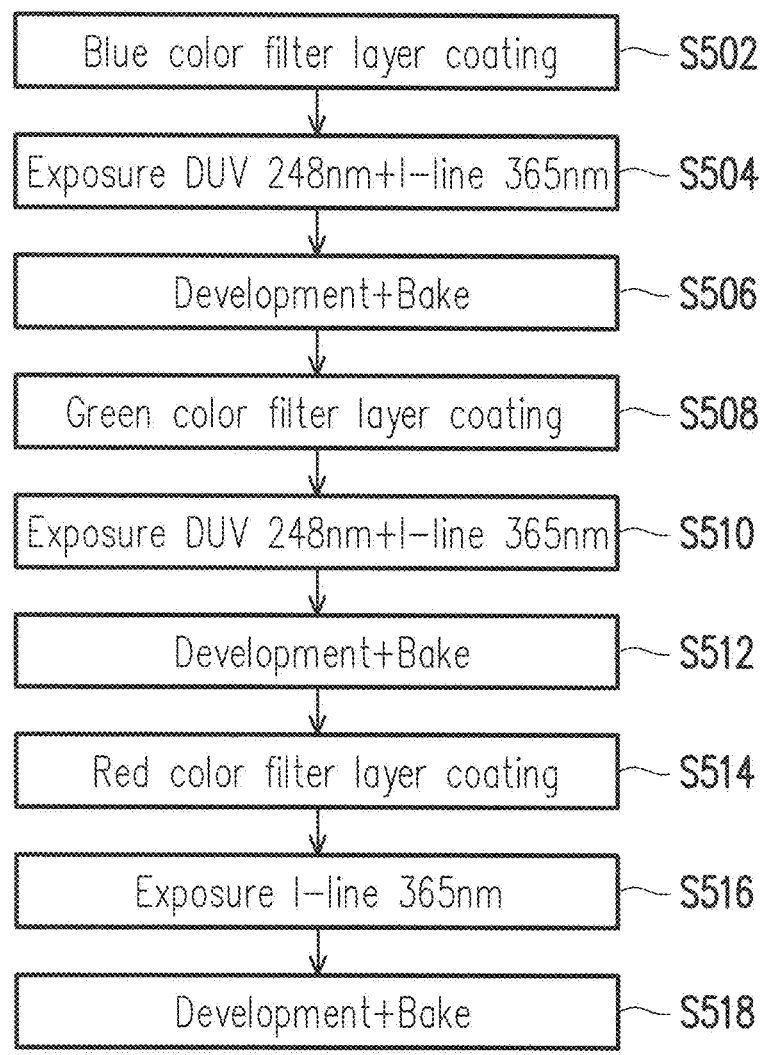
FIG. 5 is a flow chart of the manufacturing process steps of color filters according to one embodiment of the present invention.

FIG. 5 is a flow chart of the manufacturing process steps of color filters according to one embodiment of the present invention. The layout of the pattern of the blue, green and red color filters may refer to FIGS. 4A-4D.

As described in Step S502 of FIG. 5, a blue color filter layer is coated. Then, in Step S504, the blue color filter layer is exposed twice by the two-stage exposure process of a first exposure step using the DUV light at 248 nm and then a second exposure step using i-line light at 365 nm. In Step 506, the development process is performed to remove the unexposed portions of the blue color filter layer, and then a baking (post-baking) process is performed, so that blue color filters in a specific pattern are obtained. In Step S508 of FIG. 5, a green color filter layer is coated over the blue color filters. Then, in Step S510, the green color filter layer is exposed twice by the two-stage exposure process of a first exposure step using the DUV light at 248 nm and then a second exposure step using i-line light at 365 nm. In Step 512, the development process is performed to remove the unexposed portions of the green color filter layer, and then a baking (post-baking) process is performed, so that green color filters in a specific pattern are obtained. In Step S514, a red color filter layer is coated over the green color filters and the blue color filters. Then, in Step S516, the red color filter layer is exposed by performing an exposure process using i-line light at 365 nm. In Step 518, the development process is performed to remove the unexposed portions of the red color filter layer, and then a baking (post-baking) process is performed, so that red color filters in a specific pattern are obtained.

In the above embodiments, depending on the pattern design of the color filters and the required resolution for the pattern, the two-stage exposure process may be used to form the color filters of higher resolution.

In some embodiments of the present invention, the photoresist layers (color filter layers) of various grades may be used in combination. It is known the photoresist layer of higher resolution may be more expensive. By using the two-stage exposure process and the photoresist layers (color filter layers) of different levels of resolution, the color filters of higher resolution can be formed at a lower cost.

Figure 6:
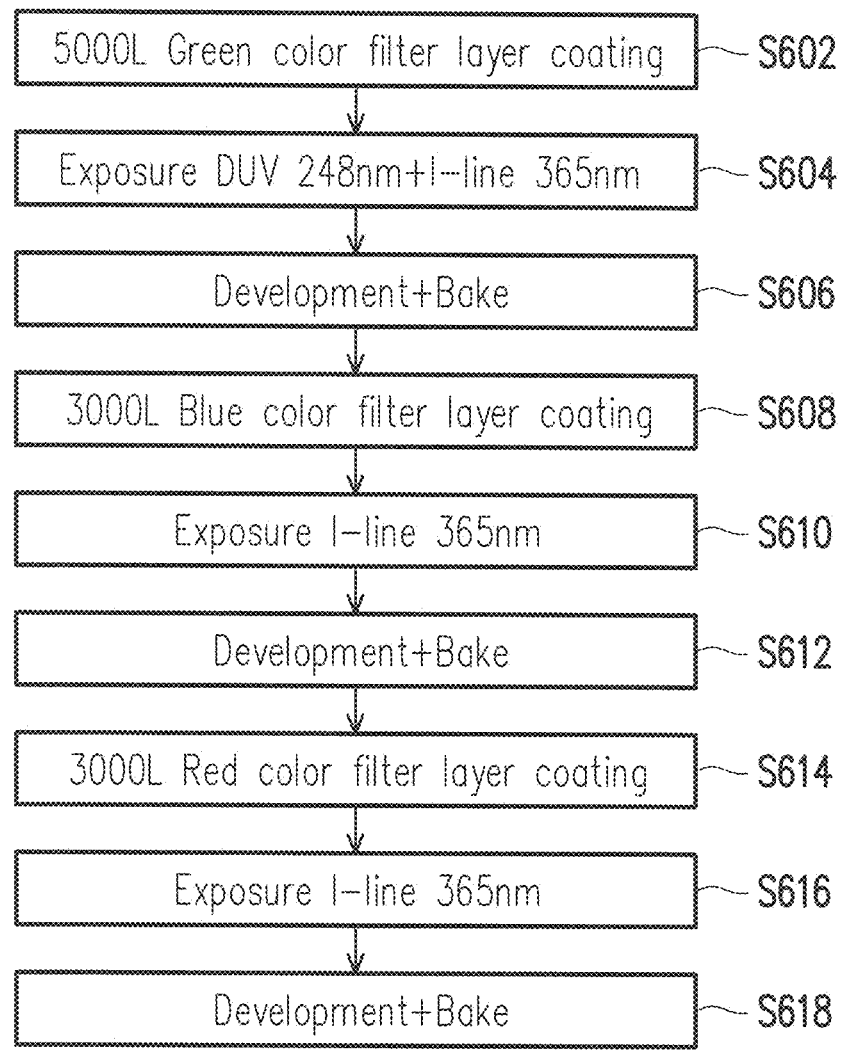
FIG. 6 is a flow chart of the manufacturing process steps of color filters according to another embodiment of the present invention.

FIG. 6 is a flow chart of the manufacturing process steps of color filters according to one embodiment of the present invention. The layout of the pattern of the green, blue and red color filters may refer to FIGS. 2A-2D.

As described in Step S602 of FIG. 6, a mid-resolution green color filter layer is coated. In this embodiment, the mid-resolution green color filter layer is a 5000L green color filter layer. Then, in Step S604, the mid-resolution green color filter layer is exposed twice by the two-stage exposure process of a first exposure step using the DUV light at 248 nm and then a second exposure step using i-line light at 365 nm. In Step 606, the development process is performed to remove the unexposed portions of the mid-resolution green color filter layer, and then a baking (post-baking) process is performed, so that green color filters in a specific pattern are obtained. In Step S608, a low-resolution blue color filter layer is coated over the green color filters. In this embodiment, the low-resolution blue color filter layer is a 3000L blue color filter layer. Then, in Step S610, the low-resolution blue color filter layer is exposed by performing an exposure process using i-line light at 365 nm. In Step 612, the development process is performed to remove the unexposed portions of the low-resolution blue color filter layer, and then a baking (post-baking) process is performed, so that blue color filters in a specific pattern are obtained. In Step S614, a low-resolution red color filter layer is coated over the green color filters and the blue color filters. In this embodiment, the low-resolution red color filter layer is a 3000L red color filter layer. Then, in Step S616, the low-resolution red color filter layer is exposed by performing an exposure process using i-line light at 365 nm. In Step 618, the development process is performed to remove the unexposed portions of the red color filter layer, and then a baking (post-baking) process is performed, so that red color filters in a specific pattern are obtained.

In this embodiment, in reference to FIGS. 2A-2D, since the location(s) of the to-be-formed blue color filters 220c or be to-be-formed red color filters 230c are enclosed by the previously formed green color filters 210b, the photoresist layers of lower resolution (e.g., 3000L) are used for the blue or red color filter layer and the two-stage exposure process attributed to higher resolution of color filter pattern is not performed.

Figure 7:
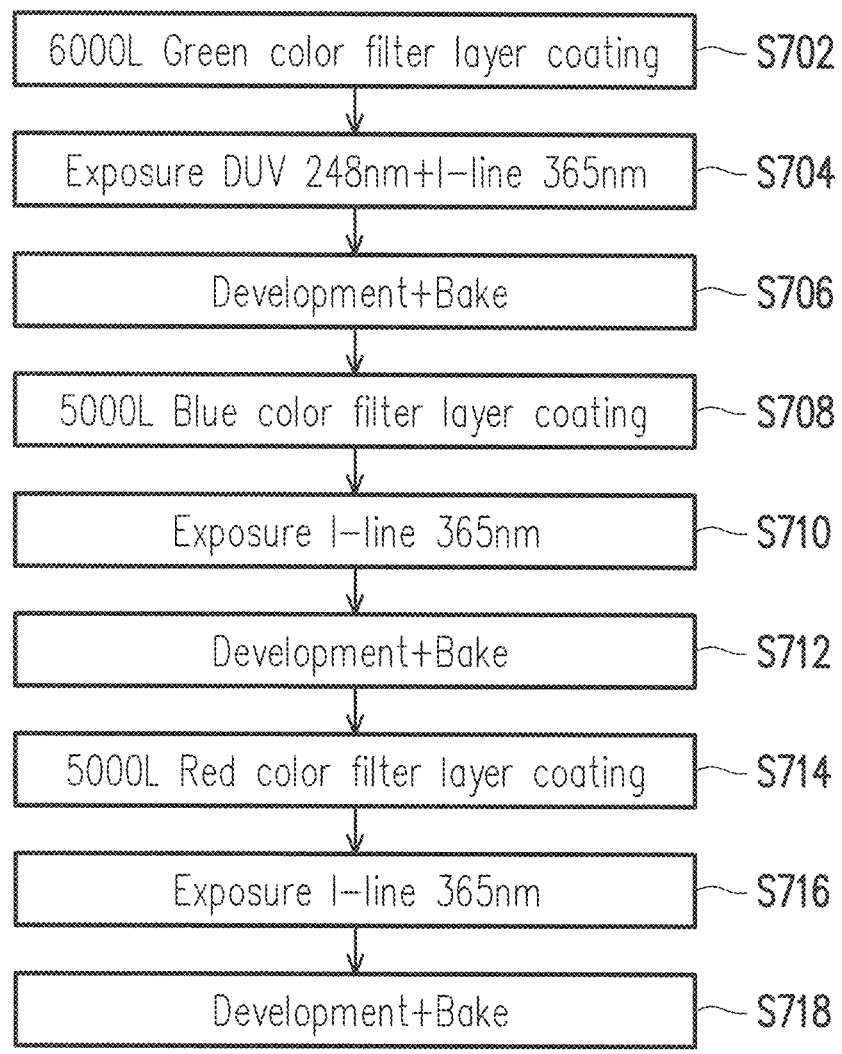
FIG. 7 is a flow chart of the manufacturing process steps of color filters according to another embodiment of the present invention.

FIG. 7 is a flow chart of the manufacturing process steps of color filters according to one embodiment of the present invention. The layout of the pattern of the green, blue and red color filters may refer to FIGS. 2A-2D.

As described in Step S702 of FIG. 7, a high-resolution green color filter layer is coated. In this embodiment, the high-resolution green color filter layer is a 6000L green color filter layer. Then, in Step S704, the high-resolution green color filter layer is exposed twice by the two-stage exposure process of a first exposure step using the DUV light at 248 nm and then a second exposure step using i-line light at 365 nm. In Step 706, the development process is performed to remove the unexposed portions of the high-resolution green color filter layer, and then a baking (post-baking) process is performed, so that green color filters in a specific pattern are obtained. In Step S708, a mid-resolution blue color filter layer is coated over the green color filters. In this embodiment, the mid-resolution blue color filter layer is a 5000L blue color filter layer. Then, in Step S710, the mid-resolution blue color filter layer is exposed by performing an exposure process using i-line light at 365 nm. In Step 712, the development process is performed to remove the unexposed portions of the mid-resolution blue color filter layer, and then a baking (post-baking) process is performed, so that blue color filters in a specific pattern are obtained. In Step S714, a mid-resolution red color filter layer is coated over the green color filters and the blue color filters. In this embodiment, the mid-resolution red color filter layer is a 5000L red color filter layer. Then, in Step S716, the mid-resolution red color filter layer is exposed by performing an exposure process using i-line light at 365 nm. In Step 718, the development process is performed to remove the unexposed portions of the mid-resolution red color filter layer, and then a baking (post-baking) process is performed, so that red color filters in a specific pattern are obtained.

In this embodiment, in reference to FIGS. 2A-2D, since the location(s) of the to-be-formed blue color filters 220c or be to-be-formed red color filters 230c are enclosed by the previously formed green color filters 210b, the photoresist layers of lower resolution (e.g., 5000L) are used for the blue or red color filter layer and the two-stage exposure process attributed to higher resolution of color filter pattern is not performed.

By using the photoresist layer of a higher resolution and the two-stage exposure process as the first exposure process, the obtained photoresist pattern (e.g., green color filters) has a better resolution and such photoresist pattern further limits the locations of the subsequently formed color filters (e.g., blue or red color filters).

It is known the photoresist layer of higher resolution may be more expensive. By using the two-stage exposure process capable of achieving higher resolution, the photoresist layer (color filter layer) of a lower resolution may be used for the subsequently formed color filter layer(s). Compared with the production costs of using the color filter layers of the same levels of resolution, the products can be manufactured by using the two-stage exposure process with color filter layers of different levels of resolution according to the embodiments of the present invention at lower production costs, and the results are shown in Table 1.

TABLE 1

| Resolution level | Forming sequence | Green | Blue | Red | Cost down (%) |
| --- | --- | --- | --- | --- | --- |
| 3000 L | blue→green→red | 3000 L | 3000 L | 3000 L | 16% |
| 5000 L | green→blue→red | 5000 L | 3000 L | 3000 L | 24% |
| 6000 L | green→blue→red | 6000 L | 5000 L | 5000 L | 24% |

Figure 8:
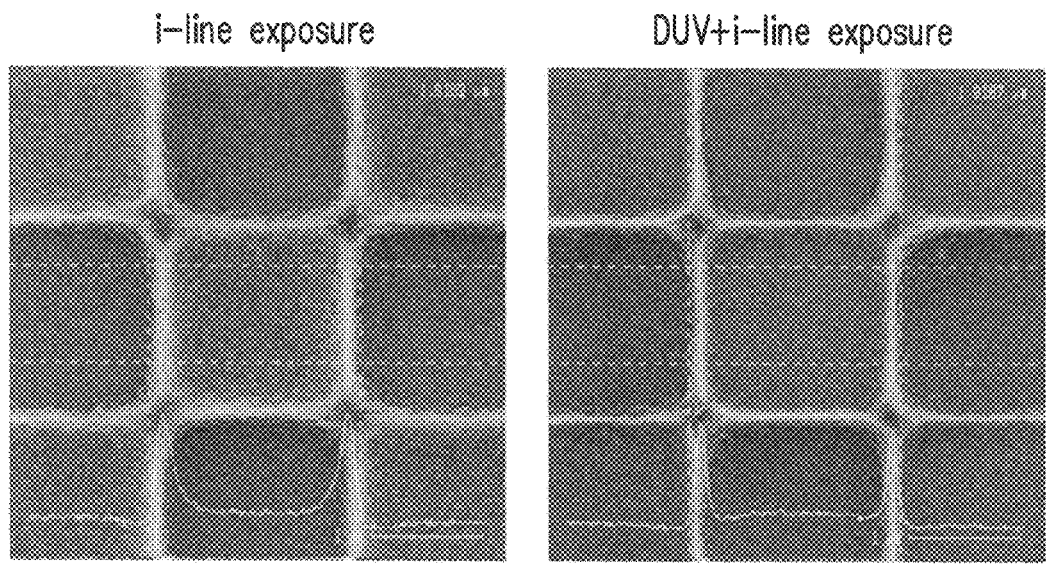
FIG. 8 shows the top view images of the color filter layers exposed by different exposure processes.
Figure 9:
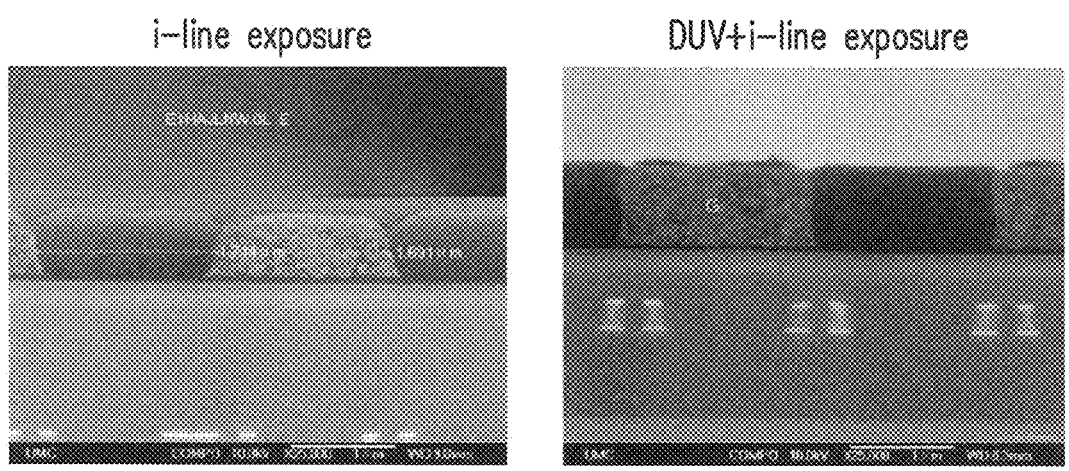
FIG. 9 shows the cross-sectional view images of the color filter layers exposed by different exposure processes.

Using the mid-resolution (5000L) color filter layers as the test samples, compared to the 5000L green color filter layer exposed by only one exposure step using i-line light at 365 nm having a depth of focus (DOF) of 0.8 microns, the 5000L green color filter layer exposed by the two-stage exposure process of a first exposure step using the DUV light at 248 nm and then a second exposure step using i-line light at 365 nm has a larger DOF (1.2 microns). As shown in FIGS. 8 & 9, the pattern profile of the 5000L green color filter layer exposed by the two-stage exposure process (DUV+i-line exposure, right part) is better and more clearly defined than that of the 5000L green color filter layer exposed by only i-line light at 365 nm (i-line exposure, left part). From the cross-sectional views of FIG. 9, the sidewall of the color filter exposed by only i-line light at 365 nm (i-line exposure, left part) is slanted, while the sidewall of the color filter layer exposed by the two-stage exposure process (DUV+i-line exposure, right part) is almost upright.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A green color filter pattern, comprising:
   a plurality of green color filters on a substrate, wherein each of the plurality of green color filters has a substantially vertical sidewall and a slant jut located at the bottom of the sidewall and protruding outwards from the sidewall, and a height of the jut is less than fifth of a height of each of the plurality of green color filters.

2. The green color filter pattern of claim 1, wherein the height of the jut is less than tenth of the height of each of the plurality of green color filters.

3. The green color filter pattern of claim 1, wherein an angle between a slat surface of the jut and the substrate is less than 30 degrees.

4. The green color filter pattern of claim 1, wherein the plurality of green color filters is arranged in a checker pattern.

5. A color filter pattern, comprising:
   a plurality of green color filters on a substrate, wherein each of the plurality of green color filters has a substantially vertical sidewall and a slant jut located at the bottom of the sidewall and protruding outwards from the sidewall, wherein a height of the jut is less than a height of each of the plurality of green color filters;
   a plurality of blue color filters, disposed on the substrate and located beside the plurality of green color filters; and
   a plurality of red color filters, disposed on the substrate and located beside the plurality of green color filters and beside the plurality of blue color filters.

6. The color filter pattern of claim 5, wherein the height of the jut is less than fifth of the height of each of the plurality of green color filters.

7. The color filter pattern of claim 5, wherein the height of the jut is less than tenth of the height of each of the plurality of green color filters.

8. The color filter pattern of claim 5, wherein an angle sandwiched between a slant surface of the slant jut and the substrate is less than 30 degrees.

9. The color filter pattern of claim 5, wherein the plurality of green color filters is arranged in a checker pattern.

10. The color filter pattern of claim 9, wherein the plurality of blue color filters is arranged in a tartan check pattern and arranged among the checker pattern of the plurality of the green color filters, wherein at least one side of each of the plurality of blue color filters is in contact with at least one side of each of the plurality of green color filters.

11. The color filter pattern of claim 10, wherein the plurality of red color filters is arranged in a tartan check pattern and arranged among the tartan check pattern of the plurality of the blue color filters, wherein at least three sides of each of the plurality of red color filters are in contact with at least three sides of each of the plurality of blue color filters.

12. The color filter pattern of claim 9, wherein the plurality of blue red filters is arranged in a tartan check pattern and arranged among the checker pattern of the plurality of the green color filters, wherein at least one side of each of the plurality of red color filters is in contact with at least one side of each of the plurality of green color filters.

13. The color filter pattern of claim 12, wherein the plurality of blue color filters is arranged in a tartan check pattern and arranged among the tartan check pattern of the plurality of the red color filters, wherein at least three sides of each of the plurality of blue color filters are in contact with at least three sides of each of the plurality of red color filters.

* * * * *